United States Patent [19]

Omura

[11] Patent Number: 4,937,835
[45] Date of Patent: Jun. 26, 1990

[54] SEMICONDUCTOR LASER DEVICE AND A METHOD OF PRODUCING SAME

[75] Inventor: Etsuji Omura, Itami, Japan

[73] Assignee: Mitsubishi Denki Kabushiki Kaisha, Japan

[21] Appl. No.: 371,041

[22] Filed: Jun. 26, 1989

[30] Foreign Application Priority Data

Jul. 8, 1988 [JP] Japan .................... 63-171524

[51] Int. Cl.[5] .............................. H01S 3/19
[52] U.S. Cl. ....................... 372/48; 372/45; 372/46; 372/47; 357/4; 437/129
[58] Field of Search .................. 372/48, 45, 46, 47; 357/4; 437/129

[56] References Cited

U.S. PATENT DOCUMENTS

| 4,594,603 | 6/1986 | Holonyak, Jr. .............. | 372/46 |
| 4,700,353 | 10/1987 | Van Gieson et al. ......... | 372/47 |
| 4,788,689 | 11/1988 | Tokuda et al. .............. | 372/45 |
| 4,817,103 | 3/1989 | Holonyak, Jr. et al. ...... | 372/45 |

FOREIGN PATENT DOCUMENTS 0276389 12/1986 Japan .................. 372/46

OTHER PUBLICATIONS

Makiuchi et al, "AlGaAs/GaAs Lateral Current Injection MQW Laser", Conference on Lasers and Electro-Optics, 1987.
Hirose et al, "AlGaAs MQW Laser with Electrodes on Epi-Layer", Preprint of Autumn Meeting, Japanese Association of Applied Physics, 1987.

*Primary Examiner*—William L. Sikes
*Assistant Examiner*—Georgia Y. Epps
*Attorney, Agent, or Firm*—Leydig, Voit & Mayer

[57] ABSTRACT

A seminconductor laser device includes a hetero-junction structure disposed in a groove in a semi-insulating semiconductor substrate having a first conductivity type first cladding layer, a quantum well active layer, and a first or second conductivity type or high resistance second cladding layer. First and second conductivity type impurity regions are selectively produced at opposite sides of an active region of the active layer and at adjacent portions of the substrate, penetrating at least the active layer. The regions of the active layer in the impurity regions are disordered. Electrodes are disposed on the substrate at the respective impurity regions.

15 Claims, 2 Drawing Sheets

SEMICONDUCTOR LASER DEVICE AND A METHOD OF PRODUCING SAME

FIELD OF THE INVENTION

The present invention relates to a semiconductor laser device and a method of producing same, and more particularly, to a laser that is appropriate for integration with other electronic elements and requires a low operating current.

BACKGROUND OF THE INVENTION

A brief construction of a prior art semiconductor laser device which is appropriate for integration with other electronic elements are shown in FIGS. 2 and 3.

Production of the prior art structure shown in FIG. 2 is started by growing a p type AlGaAs cladding layer 202, a multi-quantum well (MQW) active layer 203, an n type AlGaAs cladding layer 204, and an n type GaAs contact layer 205, successively on a semi-insulating GaAs substrate 201. Thereafter, zinc is selectively diffused to retain an n type region in a stripe shape and to produce p type diffusion regions 208. The n type GaAs contact layer 205 is selectively etched at portions where pn junctions due to the zinc diffusion would be exposed to the surface. Further, electrodes 206 and 207 are produced at the surface portions of the n type and p type layers, respectively.

In the semiconductor laser device produced, the portions of the MQW layer 203 where zinc diffusion takes place are disordered. The disordered regions become AlGaAs layers having uniform composition. This construction results in a so-called buried type laser structure.

This prior art structure of FIG. 2 has pn junctions at the peripheries (left and right side ends) of active region 209 (a region of the MQW layer 203 which is not disordered), Pn junctions produced between the n type AlGaAs layer 204 and the diffusion regions at both sides thereof. Pn junctions are produced between the active region 209 and the p type AlGaAs layer 202. In this case, the former pn junctions have a lower diffusion voltage than the latter pn junctions. When a voltage is applied between the p type and n type electrodes 207 and 206, a current flows through the pn junctions at the peripheries of active region 209 having the lower diffusion voltage, and carriers are injected into the active region 209. Then, since the peripheral portions (left and right side end portions) of the active region 209 are surrounded by AlGaAs layers having a low refractive index as described above, this region becomes a light waveguide. When the width of the waveguide is sufficiently narrow, a stable single mode oscillation is obtained, resulting in a low threshold current. In addition, the fact that both of p type and n type electrodes 207 and 206 are produced on the same main surface makes the device appropriate for integration with other electronic elements.

On the other hand, in the semiconductor laser device of the structure shown in FIG. 3, the MQW layer 209 or 203 is between high resistance AlGaAs layer 301 and 302. P type and n type impurity diffusion regions 208 and 304 are produced to reach both of the MQW layers 203, and these MQW layer regions 203 are disordered similarly as above. In this case, a current flows from the p type diffusion region 208 through the MQW active layer 209 to the n type diffusion region 304. In other words, although the current injection mechanism is a little different from the structure of FIG. 2, a semiconductor laser device appropriate for integration with other electronic elements and having good properties is also obtained.

In the prior art structure of FIG. 2, however, although a current can be effectively injected into the active region, since the refractive index difference between the active region and the AlGaAs layer at the periphery of the active region is relatively large, the width of the active region has to be made quite narrow, such as below about 2 micron, in order to obtain a single mode oscillation. Furthermore, it is quite difficult to produce an n type electrode having a low contact resistance on this narrow portion.

On the other hand, in the semiconductor laser structure of FIG. 3, since current is injected in a direction transverse to the active region, carrier concentration is distributed over some range and this results in low efficiency injection. Furthermore, the resistance value of the element becomes high, and this may restrict the highest temperature at which continuous oscillation may be safely sustained.

In both of the semiconductor laser structures of FIGS. 2 and 3, it is required that the cladding layer be relatively thick, i.e., about 2 micron in order to effectively confine the light in the active layer. It is also required to provide a GaAs layer as a contact layer in order to obtain an electrode of desirable contact properties. This results in a large thickness of about 3 micron from the wafer surface to the active layer, thereby resulting in a long diffusion time for impurity implantation. Furthermore, this results in difficulty in the application of ion implantation techniques and a large depth difference in the integration with other electronic devices.

SUMMARY OF THE INVENTION

It is an object of the present invention to provide a semiconductor laser device appropriate for integration with other electronic elements and having a low operation current.

Another object of the present invention is to provide a method of producing such a laser device.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, a double-hetero structure including a quantum well active layer is produced in a groove at a surface of a semi-insulating semiconductor substrate and an active region is produced by disordering of both side regions the quantum well active layer, utilizing impurity diffusion, and further ohmic electrodes are produced on the impurity diffusion regions at surface portions of the substrate. Therefore, the main surface of laser and the surface of substrate can be produced in the same plane. Impurity diffusion regions are selectively produced at portions other than the active region and at portions of the substrate adjacent to those portions, penetrating at least through the active layer, and these impurity diffusion regions disorder the corresponding regions of the active layer. These regions also function as regions for producing ohmic electrodes.

DETAILED DESCRIPTION OF THE PREFERRED EMBODIMENTS

An embodiment of the present invention will be described in detail with reference to the drawings.

Figure 2:
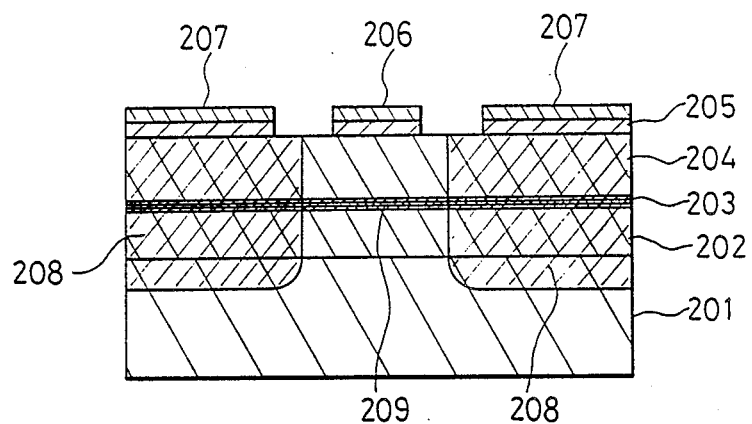
FIG. 2 is a diagram showing a cross-section of a prior art semiconductor laser device.
Figure 3:
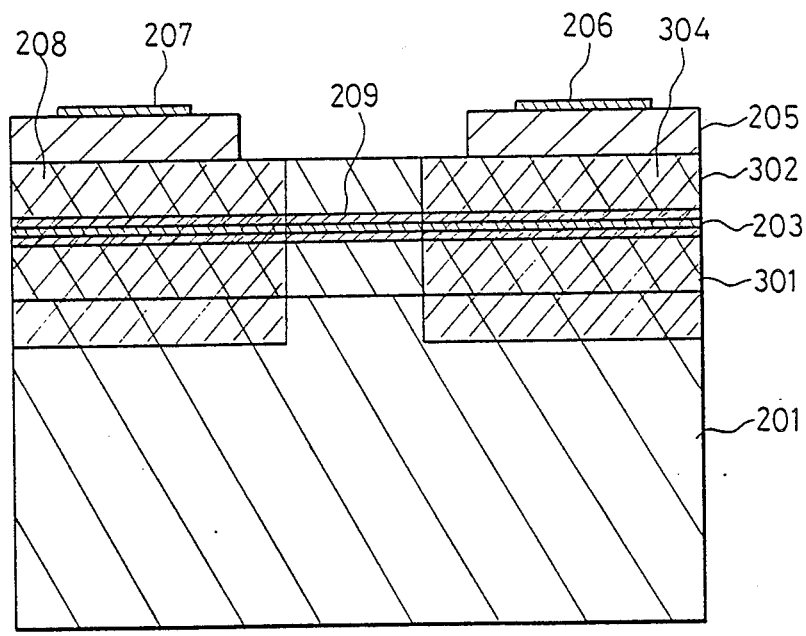
FIG. 3 is a diagram showing a cross-section of another prior art semiconductor laser device.

FIGS. 1(a) to 1(d) show production process steps for producing a semiconductor laser device according to an embodiment of the present invention. In FIG. 1, the same reference numerals designate the same or corresponding portions as those shown in FIGS. 2 and 3.

The production process of the laser device according to the present invention will be described.

Figure 1:
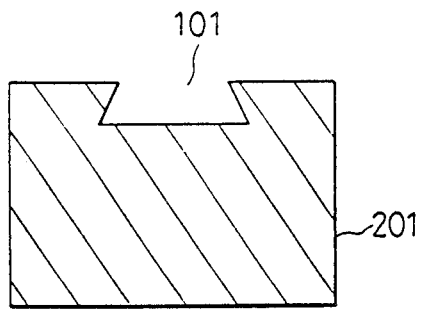
FIGS. 1(a)–1(d) are diagrams showing cross-sections of a semiconductor laser device in the respective production process steps according to an embodiment of the present invention.
Figure 1:
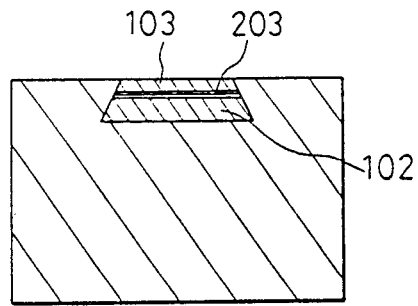
Figure 1:
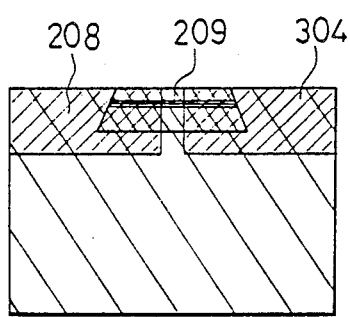
Figure 1:
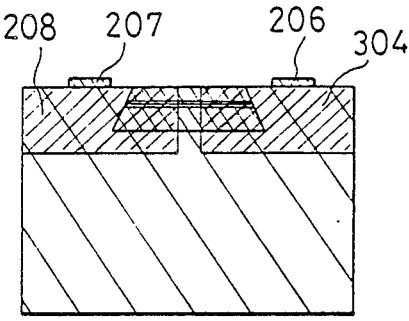

In FIG. 1, a groove 101 is produced at a <011> surface of a semi-insulating GaAs substrate 201 by conventional photolithography and chemical etching using hydrofluoric acid, hydrogen peroxide and water (FIG. 1(a)). Herein, the depth and width of the groove 101 can be set at arbitrary values, but about 3 microns in depth and about 50 microns in width are preferred.

Thereafter, in the groove section 101 an n type AlGaAs layer 102, an MQW active layer constituting a multi-quantum well 203, and a p type AlGaAs cladding layer 103 are successively grown by an MOCVD (Metal Organic Chemical Vapor Deposition) or an MBE (Molecular Beam Epitaxy) method (FIG. 1(b)).

Herein, well width of about 80 Å, barrier layer width of about 120 Å, and well number of 5 are preferred for the MQW active layer 203. Further, the aluminium composition ratio x of the $Al_xGa_{1-x}As$ wells is preferred to be 0 and that of barrier layers is preferred to be about 0.2. In order grow the respective layers in the groove 101 in a good state, an MOCVD method at a low pressure of below 50 Torr is preferred. Furthermore, the MQW active layer 203 may be p type, n type or undoped (lightly doped n type or p type). In this case, n type is employed.

Subsequently, at opposite sides of the crystal growth portions and in the GaAs portions adjacent thereto, a p type diffusion region 208 and an n type diffusion region 304 are selectively produced utilizing selective diffusions (FIG. 1(c)). In this case, zinc or beryllium is used as the p type impurities and Si or S is used as the n type impurities. A closed tube diffusion method or solid phase diffusion method is employed to produce the diffusion regions. In this embodiment, an ion implantation method can be utilized because a contact layer is not required at the surface of substrate and the depth of the active layer can be about 2 microns. When the ion implantation method is utilized, it is necessary to disorder the MQW active layer 203 by conducting an annealing for about two hours at a temperature of about 800° C. As an example of the penetration depth of impurities here, impurities are shown penetrating beyond the groove 101 in the figure. However, it may be that the depth of penetration is approximately as deep as the MQW active layer 203. Then, the respective region of the MQW active layer into which impurities are introduced become an AlGaAs layer having uniform composition, and a refractive index waveguide structure similar to that of the buried crescent type laser is produced.

At last, p type and n type electrodes 207 and 206 are produced on the substrate surface portions at the p type diffusion region 208 and n type diffusion region 304, respectively (FIG. 1(d)). AuZn/Au is used for the p type electrode and AuGe/Au is used for the n type electrode. When the impurity concentrations at these respective diffused (or ion implanted) regions are high, AuGe/Au can be employed for both the p type and n type electrodes.

In the embodiment described, the pn junctions are produced at the following three portions:

(1) the end of the n type impurity diffusion region 304 and the p type AlGaAs cladding layer 103, (2) a region between the active region 209 and the p type AlGaAs layer 103, and (3) a region between the active region 209 and the end of the p type impurity diffusion region 208.

Because the junction portion of (1) is an AlGaAs junction having a high potential barrier, when the element is biased in the forward direction, current flows through the junction portions of (2) and (3) having lower potential barriers and is effectively injected into the active region, without flowing through the junction portion of (1). Furthermore, this current injection into the active region is not only conducted in the transverse direction as in the prior art construction but also conducted from the wide p type AlGaAs layer 103 located above the active region. Thus the carriers are injected uniformly and can effectively contribute to laser oscillation. Although a pn junction is produced at the upper side of the active layer here, if it is sufficient that a pn junction be produced between the active layer and one of the cladding layers, the other cladding layer may be of any type and the conductivity types of the confronting cladding layers may be the same. In this case, carriers are injected into the active layer both from above and below.

In the embodiment described above, because a laser structure is produced in the groove 101 on a semi-insulating semiconductor substrate 201 and the substrate 201 itself is almost flat, it is possible to integrate other optical devices or electronic devices on the same substrate 201 after the production of laser structure. Even when the controllability of growth of the respective layers 102, 203, and 103 in the groove 101 is inferior and they are not produced in parallel planes providing a step difference, the p type and n type electrodes 207 and 206 can be produced on the GaAs substrate without straddling the step difference. Therefore, complicated wiring processes such as air bridging are not required and the respective electrodes 207 and 206 are produced over a wide region of the GaAs substrate including a high concentration of impurities. Accordingly, production of the electrodes is simplified and a sufficiently low contact resistance is realized. There is no need to etch the contact layer and simplifying the process.

Furthermore, the width of the active layer in which laser oscillation occurs corresponds to a region which is not disordered by impurity introduction. The depth of this layer can be controlled to be up to 1 micron by photolithography, ion implantation, or focused ion beam method.

While in the above illustrated embodiment an active layer comprises a multi-quantum well, the active layer is not restricted thereto and may comprise a single quantum well. Furthermore, the aluminum composition ratio of the p type and n type AlGaAs cladding layers sandwiching the active layer may be non-uniform in their respective layers, and a so-called graded type laser in which the aluminum composition ratio is varied with the thickness of the cladding layer may be utilized.

While in the above illustrated embodiment a laser structure utilizing a AlGaAs series semiconductor material is described, the present invention may be also applied to a laser structure utilizing other semiconductor material such as a InP series material with the same effects as described above.

As discussed above, a hetero-junction structure having a first conductivity type first cladding layer, a quantum well active layer, and a first or second conductivity type high resistance second cladding layer is provided in a groove produced on a surface of a semi-insulating semiconductor substrate. Accordingly, the surface of the hetero-junction structure and the surface of semi-insulating substrate can be made flat in the same plane, and integration of the laser with other optical devices or electronic devices on this substrate can be conducted quite easily. Furthermore, impurity diffusion regions to which first conductivity type or second conductivity type impurities are introduced into and penetrate the active layer can be selectively produced at portions other than the active region among the quantum-well active layer and at substrate portions adjacent to those portions. Then, the corresponding portions of the active layer in the impurity diffusion regions are disordered, and the respective electrodes are produced on at least portions on the impurity diffusion regions. This enables easy production of electrodes on portions of the GaAs substrate. Furthermore, an ohmic contact of sufficiently low contact resistance can be obtained and contact layers which are required in the prior art devices can be avoided, thereby resulting in a relatively simple structure and relatively easy production.

What is claimed is:

1. A semiconductor laser device comprising:
   a hetero-junction structure disposed in a groove in a semi-insulating semiconductor substrate including a first conductivity type first cladding layer, a quantum well active layer, and a second cladding layer;
   first and second conductivity type impurity regions respectively disposed in said substrate on opposite sides of an active region of said active layer, in said substrate adjacent said active region and penetrating said active layer,
   said quantum well active layer being disordered within said impurity regions; and
   respective first and second electrodes disposed on said substrate at said first and second impurity regions, respectively.

2. The semiconductor laser device of claim 1 wherein said substrate comprises GaAs, said first cladding layer comprises n type AlGaAs, said second cladding layer comprises p type AlGaAs, and said quantum well active layer comprises AlGaAs/GaAs/AlGaAs.

3. The semiconductor laser device of claim 2 wherein said active layer comprises an $Al_{0.2}Ga_{0.8}As/GaAs/Al_{0.2}Ga_{0.8}As$ quantum well structure.

4. The semiconductor laser device of claim 2 wherein said active layer comprises a multi-quantum well.

5. The semiconductor laser device of claim 2 wherein said active layer comprises a single-quantum well.

6. The semiconductor laser device of claim 2 wherein said first impurity region includes impurities selected from the group consisting of Zn and Be and said second impurity region includes impurities selected from the group consisting of Si and S.

7. The semiconductor laser device of claim 6 wherein said impurity regions are produced by diffusing impurities utilizing a closed tube method.

8. The semiconductor laser device of claim 6 wherein said impurity regions are produced by diffusing impurities utilizing a solid phase diffusion method.

9. The semiconductor laser device of claim 2 wherein said first electrode comprises AuZn/Au and said second electrode comprises AuGe/Au.

10. The semiconductor laser device of claim 2 wherein said first and second electrodes comprise AuGe/Au.

11. The semiconductor laser device of claim 1 wherein said hetero-junction structure is produced by a metal organic chemical vapor deposition process.

12. The semiconductor laser device of claim 1 wherein said hetero-junction structure is produced by molecular beam epitaxy.

13. A method of producing a semiconductor laser device comprising the steps of:
    forming a groove in and at a surface of a semi-insulating semiconductor substrate;
    successively growing a first conductivity type first cladding layer, a quantum well active layer, and a second cladding layer in said groove to produce a hetero-junction structure;
    placing impurities into portions of said semi-insulating semiconductor substrate and said hetero-junction structure to produce a first and second conductivity type impurity region penetrating through at least portions of said active layer; and
    forming electrodes on the surface of the substrate at said respective impurity diffusion regions.

14. The semiconductor laser of claim 1 wherein said second cladding layer is one of n type, p type, or undoped.

15. The semiconductor laser of claim 2 wherein said quantum well active layer is one of n type, p type, or undoped.

* * * * *